United States Patent
Mizuno et al.

(10) Patent No.: US 11,837,966 B2
(45) Date of Patent: Dec. 5, 2023

(54) POWER CONVERSION DEVICE

(71) Applicant: Mitsubishi Electric Corporation, Tokyo (JP)

(72) Inventors: Yoshifumi Mizuno, Tokyo (JP); Yoshitsugu Hirayama, Tokyo (JP); Hirofumi Inoue, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 190 days.

(21) Appl. No.: 17/556,329

(22) Filed: Dec. 20, 2021

(65) Prior Publication Data

US 2022/0337167 A1 Oct. 20, 2022

(30) Foreign Application Priority Data

Apr. 15, 2021 (JP) .................................. 2021-068796

(51) Int. Cl.
*H05K 7/14* (2006.01)
*H05K 7/20* (2006.01)
*H02M 7/00* (2006.01)

(52) U.S. Cl.
CPC .......... *H02M 7/003* (2013.01); *H05K 7/1427* (2013.01); *H05K 7/20218* (2013.01)

(58) Field of Classification Search
CPC ...... H02M 7/003; H02M 1/00; H05K 7/1427; H05K 7/20218; H05K 7/14329; H05K 7/20927; H01G 4/228

See application file for complete search history.

(56) References Cited

U.S. PATENT DOCUMENTS

| 10,264,695 | B2 * | 4/2019 | Matsuo | ................... H02M 1/14 |
| 2008/0049476 | A1 * | 2/2008 | Azuma | ................... B60L 50/61 361/699 |
| 2008/0112201 | A1 * | 5/2008 | Yahata | .................. H02M 7/003 363/141 |
| 2010/0208427 | A1 * | 8/2010 | Horiuchi | ............ H05K 7/20927 361/699 |

(Continued)

FOREIGN PATENT DOCUMENTS

| JP | 5250442 B2 | 7/2013 |
| JP | 5505451 B2 | 5/2014 |
| JP | 5506741 B2 | 5/2014 |

*Primary Examiner* — Abhishek M Rathod
(74) *Attorney, Agent, or Firm* — Sughrue Mion, PLLC; Richard C. Turner

(57) ABSTRACT

The power conversion device includes a semiconductor module having a connection terminal, a cooler, a control board, a capacitor module, a cover, a case, and a connection busbar. The semiconductor module, the cooler, the control board, and the capacitor module are arranged in an overlapped manner as seen in the direction perpendicular to the top surface of the cooler. The capacitor module has a capacitor cell, a capacitor case, resin, and a capacitor busbar. The capacitor busbar has an inner extending portion, an opening-side extending portion, and an outer extending portion. The connection busbar extends from the connection terminal of the semiconductor module to an outer surface of the outer extending portion and has a part extending in parallel to the extending direction of the outer extending portion. The connection busbar has a capacitor connection portion at an end thereof on the outer extending portion side.

12 Claims, 18 Drawing Sheets

(56) References Cited

U.S. PATENT DOCUMENTS

| | | | |
|---|---|---|---|
| 2013/0058143 A1* | 3/2013 | Tachibana | H05K 7/14329 |
| | | | 363/131 |
| 2013/0272043 A1 | 10/2013 | Sano et al. | |
| 2014/0078803 A1 | 3/2014 | Nishihara et al. | |
| 2014/0160822 A1* | 6/2014 | Kuwano | B60L 50/40 |
| | | | 363/141 |
| 2017/0162466 A1* | 6/2017 | Sawada | B60L 50/51 |
| 2017/0330815 A1* | 11/2017 | Mische | H05K 7/1432 |
| 2017/0341638 A1* | 11/2017 | Sawada | H01L 23/473 |
| 2020/0118986 A1* | 4/2020 | Hori | H01L 23/427 |

\* cited by examiner

POWER CONVERSION DEVICE

BACKGROUND OF THE INVENTION

1. Field of the Invention

The present disclosure relates to a power conversion device.

2. Description of the Background Art

As environmentally friendly automobiles, electric vehicles (EV) or hybrid vehicles such as a hybrid electric vehicle (HEV) and a plug-in hybrid electric vehicle (PHEV) are being developed. For electric vehicles or hybrid vehicles, an electric motor is used as a motive power source. In a case of driving the electric motor with AC current, a power conversion device including an inverter is mounted on the vehicle in order to convert DC current supplied from a DC power supply such as a battery to AC current. The power conversion device includes a semiconductor module including switching semiconductor elements for power conversion for converting DC current to AC current, a driving circuit for the semiconductor module, a control circuit for controlling these, and a capacitor for smoothing current. In recent years, as the power conversion device has an increasingly high output, the sizes of the semiconductor module and the capacitor tend to become larger.

Meanwhile, ease of mounting of the power conversion device to the vehicle is required, and therefore size reduction in the power conversion device is an important issue. Accordingly, disclosed is a power conversion device for which size reduction is achieved by, for example, arranging components efficiently using the space inside a housing of the power conversion device or incorporating the components in a module (see, for example, Patent Document 1). While there is severe limitation on the available space in the power conversion device under the on-vehicle environment and thus size reduction in the power conversion device is required, increase in the output of the power conversion device is also important, and therefore it is important to secure a space for placing such a high-output semiconductor module in the internal space.

In the above disclosed power conversion device, the semiconductor module and the capacitor are connected via a capacitor busbar provided to the capacitor. The capacitor busbar extends from the capacitor to a side portion of the semiconductor module, and has a through hole at an end on the semiconductor module side. A through hole is provided also at an end of a conductive plate connected to the semiconductor module. Both through holes are fastened by a screw. By the screw fastening, the semiconductor module and the capacitor are connected.

Patent Document 1: Japanese Laid-Open Patent Publication No. 2010-183748

In Patent Document 1, the semiconductor module and the capacitor are connected via the capacitor busbar extending from the capacitor side to the side portion of the semiconductor module, whereby the power conversion device can be downsized. However, since the capacitor busbar extends from the capacitor to the side portion of the semiconductor module, a space for connection is needed around the semiconductor module, so that there is a problem that it is difficult to secure a space for placing the high-output semiconductor module in the limited space of the power conversion device. In addition, in order to ensure an insulation distance, a connection part between the capacitor busbar and the semiconductor module needs to be provided with a predetermined gap kept from a conductive portion such as a housing wall surface. Thus, there is a problem that it is difficult to secure a space for placing the high-output semiconductor module in the limited space of the power conversion device.

In addition, when the capacitor busbar extends from the capacitor side to the side portion of the semiconductor module, the dimension accuracy of the end part of the capacitor busbar connected to the semiconductor module is lowered due to the influence of resin sealing a capacitor cell. Therefore, it is necessary to take a measure such as securing a certain clearance in assembling the semiconductor module and the capacitor, so that a space for a clearance or the like is needed around the semiconductor module. Thus, there is a problem that it is difficult to secure a space for placing the high-output semiconductor module in the limited space of the power conversion device.

SUMMARY OF THE INVENTION

Accordingly, an object of the present disclosure is to provide a power conversion device having a reduced size while securing a space for placing a high-output semiconductor module.

A power conversion device according to the present disclosure includes: a semiconductor module having a body portion which has a semiconductor element therein and is formed in a plate shape, and a connection terminal electrically connected to the semiconductor element and protruding from the body portion; a cooler having a bottom surface, a top surface, and a side surface, the top surface being thermally connected to one surface of the semiconductor module; a control board for controlling operation of the semiconductor module; a capacitor module placed on the bottom surface side of the cooler or the top surface side of the cooler, and electrically connected to the semiconductor module; a cover which stores the semiconductor module and the control board, and stores the capacitor module when the capacitor module is placed on the top surface side, the cover being fixed to the top surface of the cooler; a case which stores the capacitor module when the capacitor module is placed on the bottom surface side, the case being fixed to the bottom surface of the cooler; and a connection busbar connecting the connection terminal of the semiconductor module and the capacitor module. The semiconductor module, the cooler, the control board, and the capacitor module are arranged in an overlapped manner as seen in a direction perpendicular to the top surface of the cooler. The capacitor module has a capacitor cell, a bottomed tubular capacitor case which stores the capacitor cell and opens on the cooler side, resin sealing the capacitor cell inside the capacitor case, and a capacitor busbar electrically connected to the capacitor cell and exposed to outside from the resin. The capacitor busbar has an inner extending portion extending to an opening side along an inner surface of a side wall of the capacitor case, an opening-side extending portion extending from an opening-side end of the inner extending portion to an outer side along an opening-side end surface of the side wall, and an outer extending portion extending from an outer end of the opening-side extending portion to a bottom wall side along an outer surface of the side wall. The connection busbar extends from the connection terminal of the semiconductor module to an outer surface of the outer extending portion and has a part extending in parallel to an extending direction of the outer extending portion, and the connection busbar has a capacitor connection portion connected to the outer extending portion, at an end of the connection busbar on the outer extending portion side.

In the power conversion device according to the present disclosure, the capacitor busbar has the outer extending portion extending to the bottom wall side along the outer surface of the side wall of the capacitor case, the connection busbar extends from the connection terminal of the semiconductor module to the outer surface of the outer extending portion and has a part extending in parallel to the extending direction of the outer extending portion, and the connection busbar has the capacitor connection portion connected to the outer extending portion, at the end of the connection busbar on the outer extending portion side. Thus, the structure for connecting the semiconductor module and the capacitor module can be provided on the capacitor module side, whereby it is possible to secure a space for placing the high-output semiconductor module on the top surface side of the cooler. Since the high-output semiconductor module can be placed, the output of the power conversion device can be increased. In addition, since the structure for connecting the semiconductor module and the capacitor module can be provided on the capacitor module side and the capacitor busbar is placed along the outer surface of the side wall of the capacitor case, a required clearance between components in assembling is reduced, and the insulation distance for which the dimension accuracy of placement of the capacitor busbar is considered can be shortened, whereby the power conversion device can be downsized.

DETAILED DESCRIPTION OF THE PREFERRED EMBODIMENTS OF THE INVENTION

Figure 1:
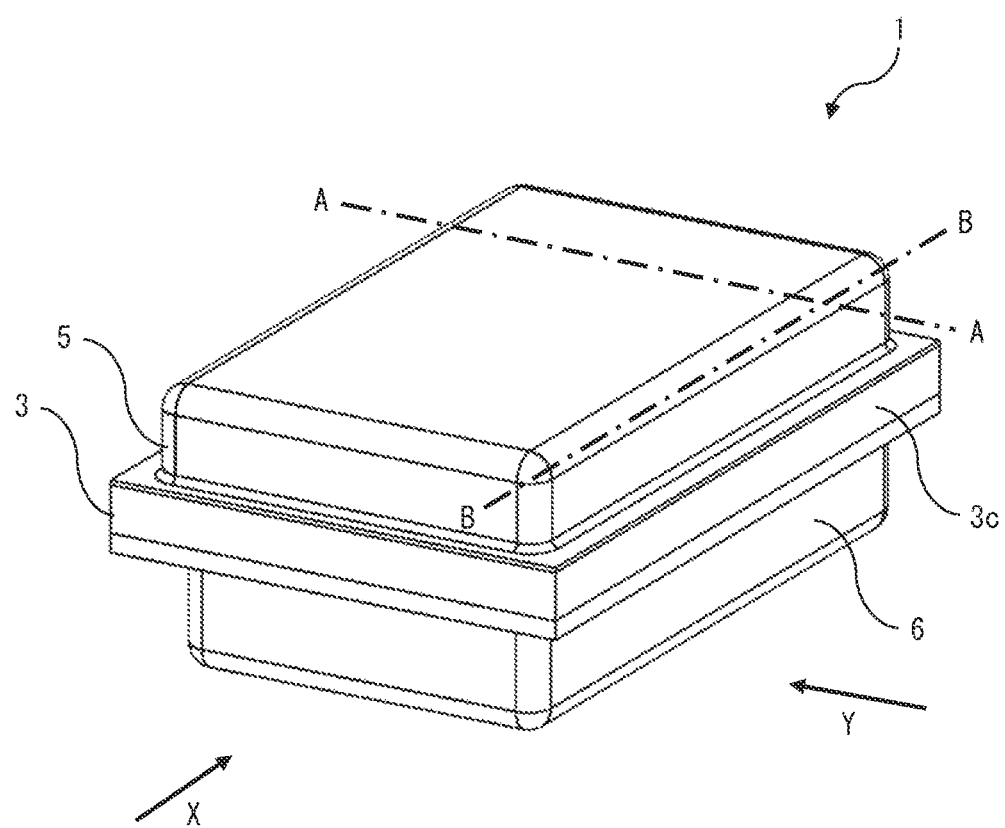
FIG. 1 is a perspective view showing the outer appearance of a power conversion device according to the first embodiment of the present disclosure.

Hereinafter, a power conversion device according to embodiments of the present disclosure will be described with reference to the drawings. In the drawings, the same or corresponding members and parts are denoted by the same reference characters, to give description.

First Embodiment

Figure 2:
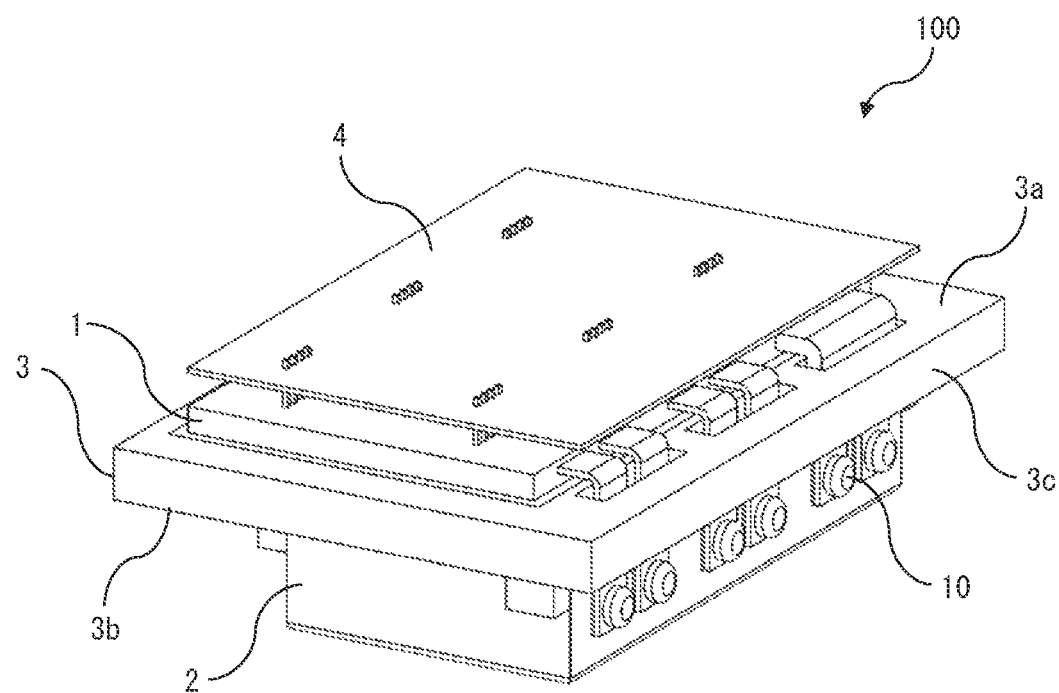
FIG. 2 is a perspective view showing a specific part of the power conversion device according to the first embodiment.
Figure 3:
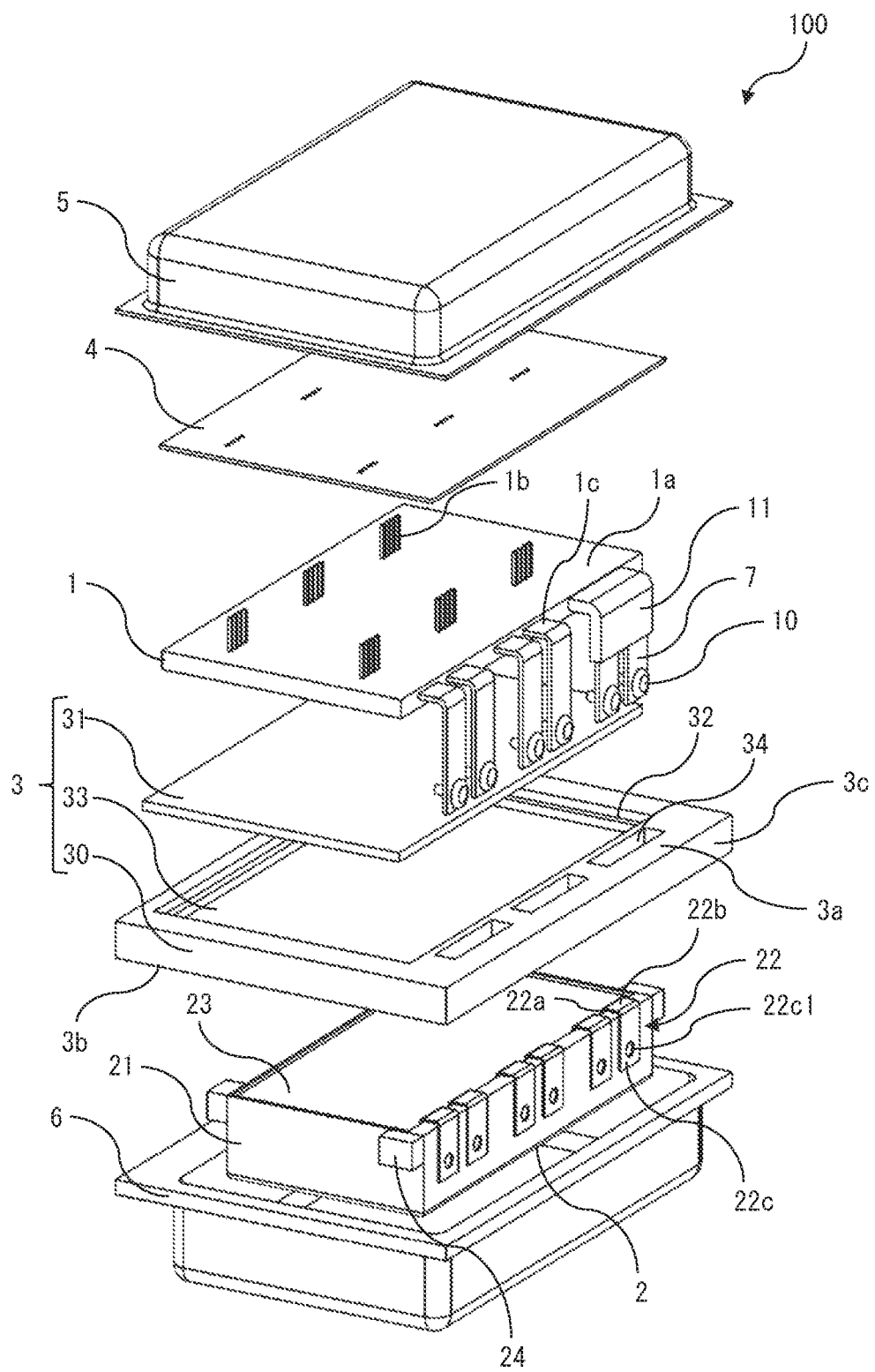
FIG. 3 is an exploded perspective view of the power conversion device according to the first embodiment.
Figure 4:
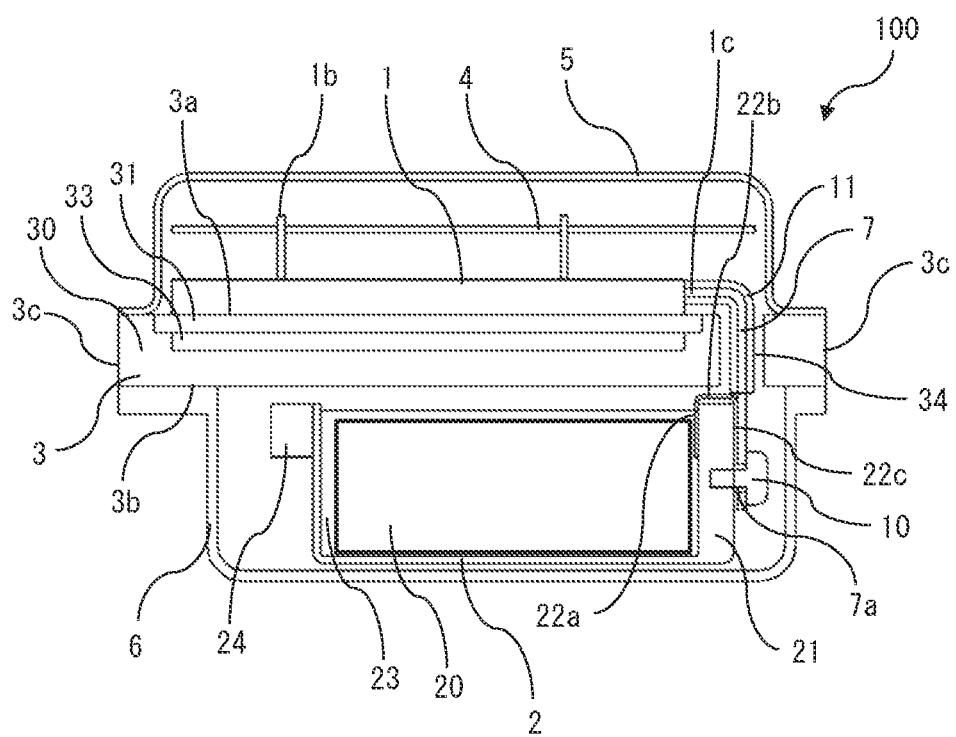
FIG. 4 is a sectional view schematically showing the power conversion device along line A-A in FIG. 1.
Figure 5:
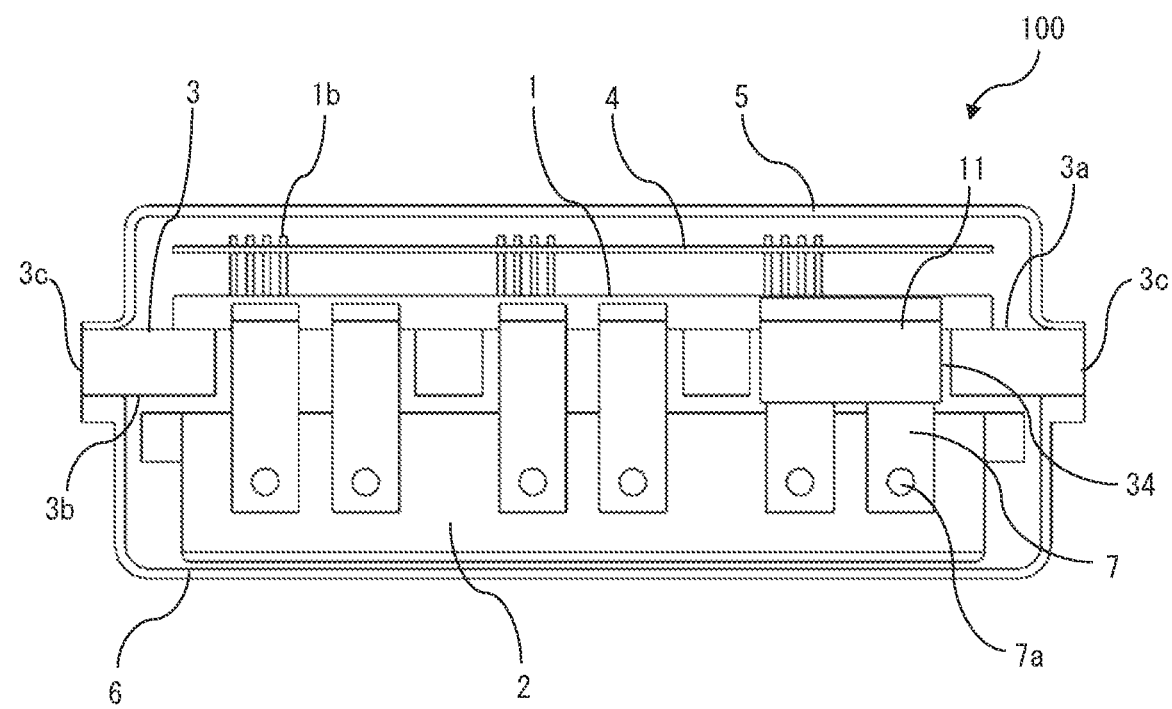
FIG. 5 is a sectional view schematically showing the power conversion device along line B-B in FIG. 1.

FIG. 1 is a perspective view showing the outer appearance of a power conversion device 100 according to the first embodiment of the present disclosure, FIG. 2 is a perspective view showing a specific part of the power conversion device 100, with a cover 5 and a case 6 removed, FIG. 3 is an exploded perspective view of the power conversion device 100, FIG. 4 is a sectional view schematically showing the power conversion device 100 along line A-A in FIG. 1, and FIG. 5 is a sectional view schematically showing the power conversion device 100 along line B-B in FIG. 1, with screws 10 not shown. In FIG. 1, a side indicated by an arrow X is defined as a front surface side of the power conversion device 100, and a side indicated by an arrow Y is defined as a side surface side of the power conversion device 100. The power conversion device 100 is a device for converting DC power or AC power to AC power or DC power and outputting the converted power.

<Power Conversion Device 100>

The power conversion device 100 is an inverter or a converter used in a vehicle such as electric vehicle or a hybrid vehicle, for example. The inverter converts DC current of a battery to AC current for driving an electric motor including a motor. The converter converts AC current generated by an electric generator to DC current for charging the battery. In addition, the power conversion device 100 converts voltage by a boost converter and a step-down converter, for converting energy between a low-voltage battery and a high-voltage battery.

As shown in FIG. 3, the power conversion device 100 includes a semiconductor module 1, a capacitor module 2 electrically connected to the semiconductor module 1, a cooler 3 having a bottom surface 3b, a top surface 3a, and side surfaces 3c, a control board 4 for controlling operation of the semiconductor module 1, the cover 5, the case 6, and connection busbars 7 connecting the semiconductor module 1 and the capacitor module 2. The semiconductor module 1, the cooler 3, the control board 4, and the capacitor module 2 are arranged in an overlapped manner as seen in the direction perpendicular to the top surface 3a of the cooler 3. Since the semiconductor module 1, the cooler 3, the control board 4, and the capacitor module 2 are arranged in an overlapped manner, the power conversion device 100 can be downsized. As shown in FIG. 1, the power conversion device 100 is formed such that the cover 5 and the case 6 are attached to the cooler 3 by, for example, screws (not shown) and a housing is formed by the cooler 3, the cover 5, and the case 6, and then is mounted to the vehicle. In FIG. 1, an opening for input/output of the power conversion device 100 is not shown.

The semiconductor module 1 has a body portion 1a which has semiconductor elements (not shown) therein and is formed in a plate shape, and first connection terminals 1b and second connection terminals 1c which are connection terminals electrically connected to the semiconductor elements and protruding from the body portion 1a. The top surface 3a of the cooler 3 is thermally connected to one surface of the body portion 1a of the semiconductor module 1. In the power conversion device 100, when the semiconductor module 1 is driven, the semiconductor elements and a circuit connected to the semiconductor elements generate heat. Therefore, the cooler 3 cools the semiconductor module 1. Through cooling by the cooler 3, temperature increase in the semiconductor module 1 is suppressed. Owing to suppression of temperature increase of the semiconductor module 1, the power conversion device 100 having a reduced size and a high density can be efficiently driven.

In the present embodiment, the power conversion device 100 has a shape small in the direction of the arrow Y and large in the direction of the arrow X in FIG. 1. However, the shape of the power conversion device 100 is not limited thereto. Depending on the available space in which the power conversion device 100 is mounted, a shape large in the direction of the arrow Y and small in the direction of the arrow X may be employed. In addition, as shown in FIG. 2, connection between the semiconductor module 1 and the capacitor module 2 is made at a side surface side in the Y direction in which the dimension of the power conversion device 100 is small, thus suppressing size increase in the entire dimensions of the power conversion device 100. The details of connection between the semiconductor module 1 and the capacitor module 2 will be described later.

As a matter of course, the power conversion device 100 can be used in an application other than the on-vehicle application. Although not shown in FIG. 2, in the power conversion device 100, electric components such as a boost reactor are used, and a terminal block for connecting the boost reactor, etc. with the semiconductor module 1, and the like are mounted inside the power conversion device 100.

<Semiconductor Module 1 and Cooler 3>

The semiconductor module 1 and the cooler 3 will be described. The semiconductor elements included in the semiconductor module 1 are electronic components forming an inverter, a converter, an electronic relay, and the like of the power conversion device 100. The first connection terminals 1b are terminals electrically connecting the semiconductor elements and the control board 4. The second connection terminals 1c are terminals electrically connecting the semiconductor elements and the capacitor module 2. By the first connection terminals 1b, signals indicating a temperature, an operation state, and an abnormal state of the semiconductor module 1, and the like are transmitted from the semiconductor module 1 to the control board 4. In addition, by the first connection terminals 1b, a control signal for controlling the semiconductor module 1 is transmitted from the control board 4 to the semiconductor module 1. By the second connection terminals 1c, DC current of the battery (not shown) is transmitted through the capacitor module 2 to the semiconductor module 1. In the present embodiment, a configuration having six second connection terminals 1c is shown. However, the number of second connection terminals 1c is not limited thereto, and may be less than six or greater than six.

As shown in FIG. 3, the cooler 3 includes a body portion 30, a plate-shaped base 31, and a coolant passage 33. The body portion 30 and the base 31 are joined by a joining portion 32 and thus are integrated. The joining is performed by screw fastening or friction stir welding (FSW). By the joining between the body portion 30 and the base 31, the coolant passage 33 is formed inside the body portion 30. A coolant is introduced through a pipe (not shown) provided at the side surface 3c of the cooler 3 into the coolant passage 33, passes through the coolant passage 33, and then is discharged to the outside. As the coolant, for example, water or ethylene glycol solution is used. The base 31 is cooled by the coolant, and the semiconductor module 1 thermally connected to a top surface of the base 31 which is the top surface 3a of the cooler 3 is also cooled by the coolant.

As shown in FIG. 1, the side surfaces 3c of the cooler 3 are exposed to the outside. With this structure, heat generated from the semiconductor module 1, the capacitor module 2, and the like inside the power conversion device 100 can be readily dissipated to the outside. The cooler 3 is formed by die casting from aluminum, for example.

The cooler 3 is integrated with the cover 5 and the case 6, thus forming a housing of the power conversion device 100. With this structure, the power conversion device 100 can have a mechanical strength capable of withstanding a load such as vibration of the vehicle due to an engine, a transmission, or the like. In addition, with this structure, the power conversion device 100 has space-saving property so as to be mountable in an engine room. Thus, the cooler 3 has a structure suitable for the on-vehicle power conversion device 100.

<Capacitor Module 2>

The capacitor module 2 is placed on the bottom surface 3b side of the cooler 3 or the top surface 3a side of the cooler 3. In the present embodiment, as shown in FIG. 3, the capacitor module 2 is placed on the bottom surface 3b side of the cooler 3. The capacitor module 2 has a capacitor cell 20 (not shown in FIG. 3), a bottomed tubular capacitor case 21 which stores the capacitor cell 20 and opens on the cooler 3 side, resin 23 sealing the capacitor cell 20 inside the capacitor case 21, and capacitor busbars 22 electrically connected to the capacitor cell 20 and exposed to the outside from the resin 23. The capacitor module 2 has fastening legs 24 to be fixed to the case 6, at outer surfaces of side walls of the capacitor case 21. The capacitor case 21 is formed from resin such as polyphenylene sulfide (PPS), for example. The details of the capacitor busbars 22 to be connected to the connection busbars 7 will be described later.

In the present embodiment, the capacitor case 21 is formed in a bottomed rectangular tubular shape, and the body portion 1a of the semiconductor module 1 is formed in a rectangular plate shape. The length of one or both of a long side and a short side of the bottom wall of the capacitor case 21 is respectively smaller than the length of one or both of a long side and a short side of the body portion 1a of the semiconductor module 1. As shown in FIG. 4, in the present embodiment, the length of the short side of the bottom wall of the capacitor case 21 is smaller than the length of the short side of the body portion 1a of the semiconductor module 1. With this structure, a space for the body portion 1a of the semiconductor module 1 arranged in an overlapped manner with the capacitor module 2 can be secured irrespective of the size of the capacitor case 21. Further, the length of the long side of the bottom wall of the capacitor case 21 may be smaller than the length of the long side of the body portion 1a of the semiconductor module 1. In addition, the shapes of the capacitor case 21 and the body portion 1a of the semiconductor module 1 are not limited to rectangular shapes, and may be other shapes.

<Cover 5 and Case 6>

The cover 5 stores the semiconductor module 1 and the control board 4, and stores the capacitor module 2 when the capacitor module 2 is placed on the top surface 3a side of the cooler 3. The cover 5 is fixed to the top surface 3a of the cooler 3 by screws, for example. The cover 5 is formed from a cold rolled steel sheet such as SPCE, for example. The case 6 stores the capacitor module 2 when the capacitor module 2 is placed on the bottom surface 3b side of the cooler 3, and is fixed to the bottom surface 3b of the cooler 3 by screws, for example. The case 6 is formed from an aluminum alloy such as ADC12, for example.

As shown in FIG. 4 and FIG. 5, the cover 5 and the case 6 are each formed without protruding in outward directions away from the side surfaces 3c on both sides of the cooler 3, and are provided with appropriate insulation distances kept from conductive portions such as the semiconductor module 1, the control board 4, and the capacitor busbars 22. A fixation part between the bottom surface 3b of the cooler 3 and the case 6 can be set at a height in such a range that allows fastening work for the capacitor busbars 22 and the connection busbars 7 without hampering the fastening work. As an example, the outer periphery of the bottom surface 3b of the cooler 3 which is the fixation part between the case 6 and the cooler 3 may protrude in a rib shape. Thus, the case 6 has a structure that does not hamper the fastening work for the capacitor busbars 22 and the connection busbars 7, so that manufacturing is facilitated. Therefore, ease of assembly of the power conversion device 100 can be improved and productivity of the power conversion device 100 can be improved.

A fixation part between the top surface 3a of the cooler 3 and the cover 5 can be set at any height. The outer periphery of the top surface 3a of the cooler 3 which is the fixation part between the cover 5 and the cooler 3 may protrude in a rib shape. If the fixation part protrudes, the height of the cover 5 can be lowered, so that productivity of the cover 5 can be improved. In addition, if the fixation part of the cooler 3 protrudes, a rib is formed at the outer periphery of the top surface 3a of the cooler 3, so that stiffness of the cooler 3 is enhanced. Thus, vibration resistance of the power conversion device 100 can be improved.

<Connection Structure Between Semiconductor Module 1 and Capacitor Module 2>

A connection structure between the semiconductor module 1 and the capacitor module 2 will be described. As shown in FIG. 4, the capacitor busbar 22 connected to the connection busbar 7 has an inner extending portion 22a, an opening-side extending portion 22b, and an outer extending portion 22c. The inner extending portion 22a extends to the opening side along the inner surface of a side wall of the capacitor case 21. The opening-side extending portion 22b extends from the opening-side end of the inner extending portion 22a to the outer side along the opening-side end surface of the side wall. The outer extending portion 22c extends from the outer end of the opening-side extending portion 22b to the bottom wall side along the outer surface of the side wall. Extending to the bottom wall side along the outer surface of the side wall means that the outer extending portion 22c extends to a side approaching the bottom wall along the outer surface of the side wall or the outer extending portion 22c extends in a direction to approach the bottom wall along the outer surface of the side wall.

The connection busbar 7 extends from the second connection terminal 1c of the semiconductor module 1 to the outer surface of the outer extending portion 22c and has a part extending in parallel to the extending direction of the outer extending portion 22c. The connection busbar 7 has a capacitor connection portion 7a connected to the outer extending portion 22c, at an end of the connection busbar 7 on the outer extending portion 22c side. The capacitor connection portion 7a is a through hole. The capacitor connection portion 7a is fastened by the screw 10 to a screw hole 22c1 provided at an end of the outer extending portion 22c, whereby the connection busbar 7 and the capacitor busbar 22 are electrically connected to each other.

With such a configuration, the structure for connecting the semiconductor module 1 and the capacitor module 2 can be provided on the capacitor module 2 side, whereby it is possible to secure a space for placing the high-output semiconductor module 1 on the top surface 3a side of the cooler 3. Since the high-output semiconductor module 1 can be placed, the output of the power conversion device 100 can be increased. In addition, since the structure for connecting the semiconductor module 1 and the capacitor module 2 can be provided on the capacitor module 2 side, a connection space is not needed on the top surface 3a side of the cooler 3, and thus the power conversion device 100 can be downsized. In addition, as compared to a case where a capacitor busbar sealed with resin extends from the capacitor module side to the semiconductor module side, the capacitor busbar 22 is placed along the outer surface of the side wall of the capacitor case 21, and therefore the dimension accuracy of placement of the connection part of the capacitor busbar 22 with the semiconductor module 1 can be improved. Thus, ease of assembly of the power conversion device 100 is improved, a required clearance between components in assembling is reduced, and the insulation distance for which the dimension accuracy of placement of the capacitor busbar 22 is considered can be shortened, whereby the power conversion device 100 can be downsized.

In the present embodiment, the second connection terminal 1c of the semiconductor module 1 and the connection busbar 7 are integrally formed. With this structure, the number of components of the power conversion device 100 can be decreased, whereby productivity of the power conversion device 100 can be improved. In addition, since a part where the second connection terminal 1c and the connection busbar 7 are connected is not needed, the power conversion device 100 can be downsized.

The cooler 3 has penetration openings 34 which are through holes penetrating between the top surface 3a and the bottom surface 3b. The penetration openings 34 are provided between the coolant passage 33 and the side surface 3c. The connection busbars 7 are placed so as to penetrate through the penetration openings 34. With this structure, insulation of the connection busbars 7 is ensured while the power conversion device 100 can be downsized.

At least parts of the second connection terminal 1c and the connection busbar 7 are covered by resin 11. With this structure, insulation property between the parts of the second connection terminal 1c and the connection busbar 7 covered by the resin 11, and a conductive part therearound, can be improved. In addition, the stiffness and dimension accuracy are improved owing to the resin, whereby vibration resistance of the parts of the second connection terminal 1c and the connection busbar 7 covered by the resin 11 can be improved.

In the present embodiment, as shown in FIG. 5, the resin 11 is provided in a range to the part of the penetration opening 34. However, without limitation thereto, the resin 11 may be provided so as to extend to the side surface part of the capacitor module 2. In the present embodiment, as shown in FIG. 3, the resin 11 is provided for two connection busbars 7 arranged at the right side. However, the resin 11 may be provided for other connection busbars 7. In addition, a part for fixation with the cooler 3 may be provided to the resin 11. For example, the resin 11 may have a part extending along the top surface 3a, and an insert bush may be provided at the extending part, whereby the resin 11 can be fixed to the cooler 3 via the insert bush.

As described above, in the power conversion device 100 according to the first embodiment, the capacitor busbar 22 has the outer extending portion 22c extending to the bottom wall side along the outer surface of the side wall of the capacitor case 21, the connection busbar 7 extends from the second connection terminal 1c of the semiconductor module 1 to the outer surface of the outer extending portion 22c, and has a part extending in parallel to the extending direction of the outer extending portion 22c, and the connection busbar 7 has the capacitor connection portion 7a connected to the outer extending portion 22c, at the end of the connection busbar 7 on the outer extending portion 22c side. Thus, the structure for connecting the semiconductor module 1 and the capacitor module 2 can be provided on the capacitor module 2 side, whereby it is possible to secure a space for placing the high-output semiconductor module 1 on the top surface 3a side of the cooler 3. Since the high-output semiconductor module 1 can be placed, the output of the power conversion device 100 can be increased. In addition, since the structure for connecting the semiconductor module 1 and the capacitor module 2 can be provided on the capacitor module 2 side, a connection space is not needed on the top surface 3a side of the cooler 3, and thus the power conversion device 100 can be downsized.

The semiconductor module 1, the cooler 3, the control board 4, and the capacitor module 2 are arranged in an overlapped manner as seen in the direction perpendicular to the top surface 3a of the cooler 3, whereby the power conversion device 100 can be downsized. In addition, in a case where the second connection terminal 1c of the semiconductor module 1 and the connection busbar 7 are integrally formed, the number of components of the power conversion device 100 can be decreased, whereby productivity of the power conversion device 100 can be improved. In addition, since a part where the second connection terminal 1c and the connection busbar 7 are connected is not needed, the power conversion device 100 can be downsized.

In a case where at least parts of the second connection terminal 1c and the connection busbar 7 are covered by the resin 11, insulation property between the parts of the second connection terminal 1c and the connection busbar 7 covered by the resin 11, and a conductive part therearound, can be improved. In addition, in a case where the cooler 3 has the penetration opening 34 penetrating between the top surface 3a and the bottom surface 3b, and the connection busbar 7 is placed so as to penetrate through the penetration opening 34, insulation of the connection busbar 7 is ensured while the power conversion device 100 can be downsized.

In a case where the side surface 3c of the cooler 3 is exposed to the outside, heat generated from the semiconductor module 1, the capacitor module 2, and the like inside the power conversion device 100 can be readily dissipated to the outside. In addition, in a case where the capacitor case 21 is formed in a bottomed rectangular tubular shape, the body portion 1a of the semiconductor module 1 is formed in a rectangular plate shape, and the length of one or both of the long side and the short side of the bottom wall of the capacitor case 21 is respectively smaller than the length of one or both of the long side and the short side of the body portion 1a of the semiconductor module 1, a space for the body portion 1a of the semiconductor module 1 arranged in an overlapped manner with the capacitor module 2 can be secured irrespective of the size of the capacitor case 21.

Second Embodiment

Figure 6:
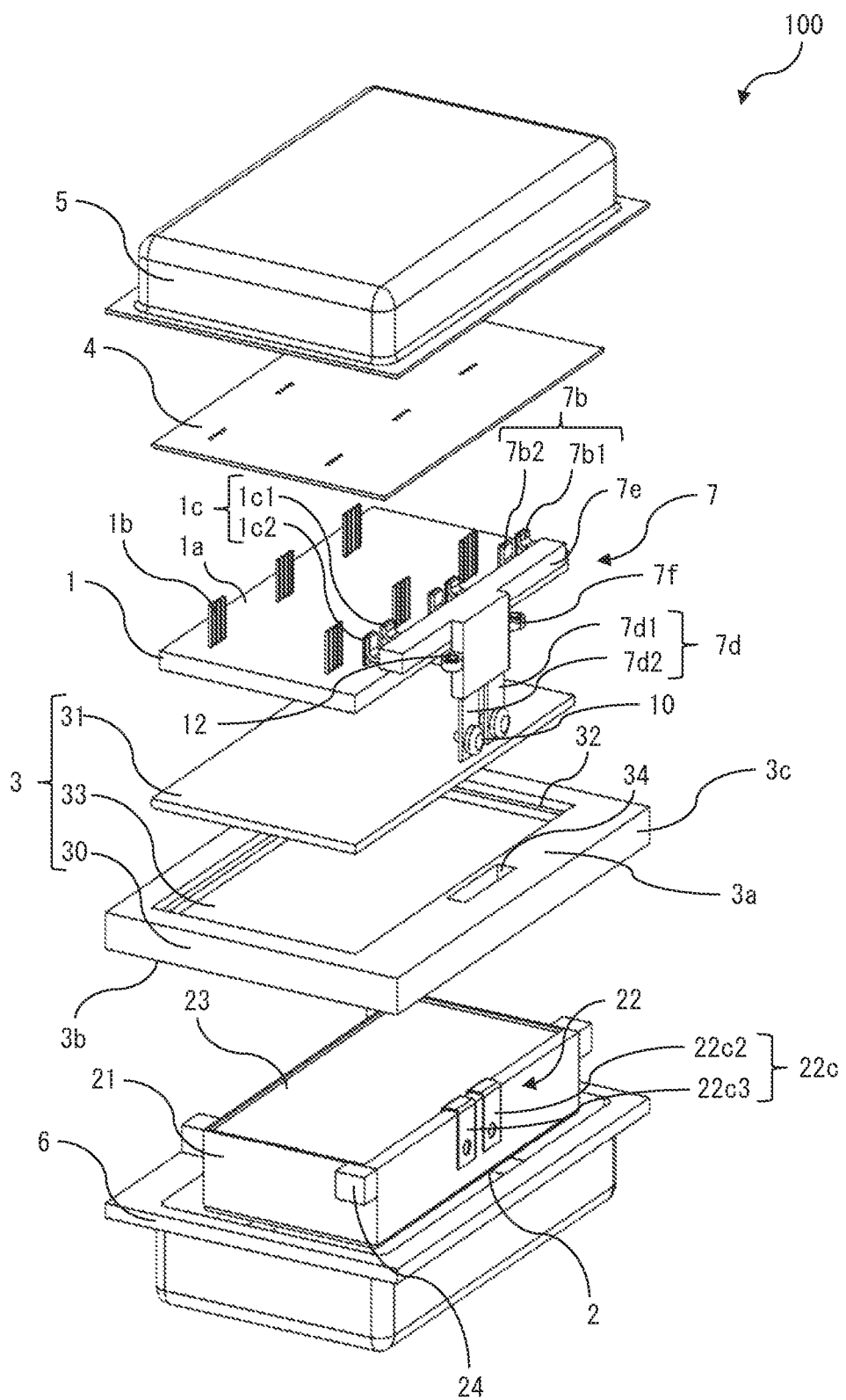
FIG. 6 is an exploded perspective view showing a power conversion device according to the second embodiment of the present disclosure.
Figure 7:
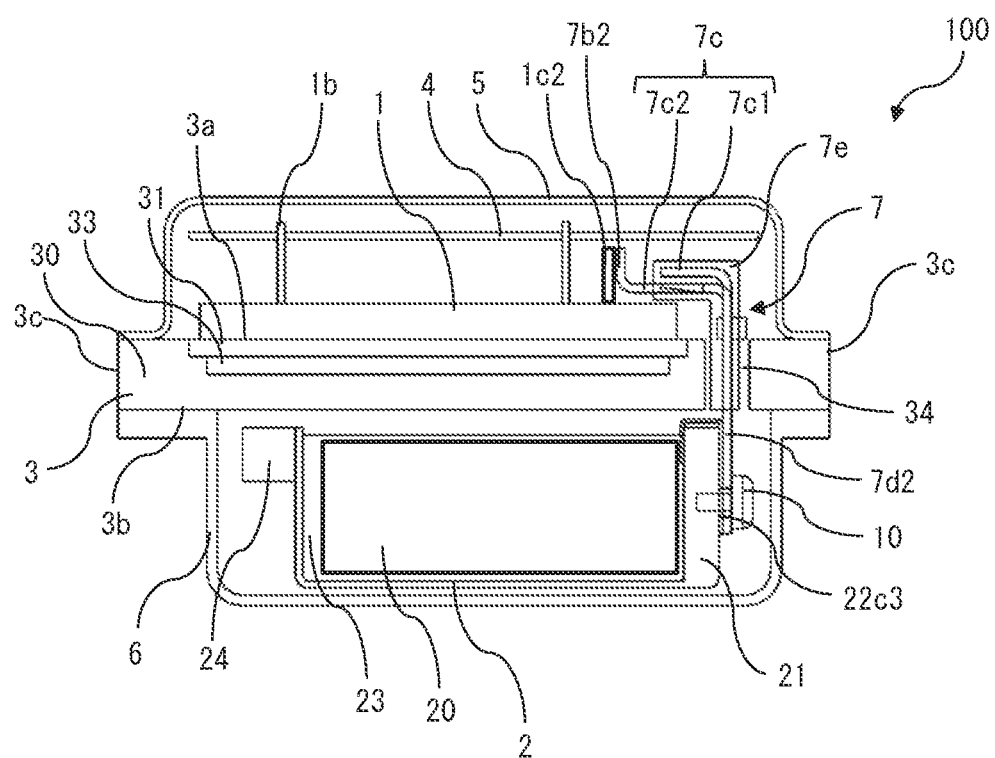
FIG. 7 is a sectional view of the power conversion device according to the second embodiment.
Figure 8:
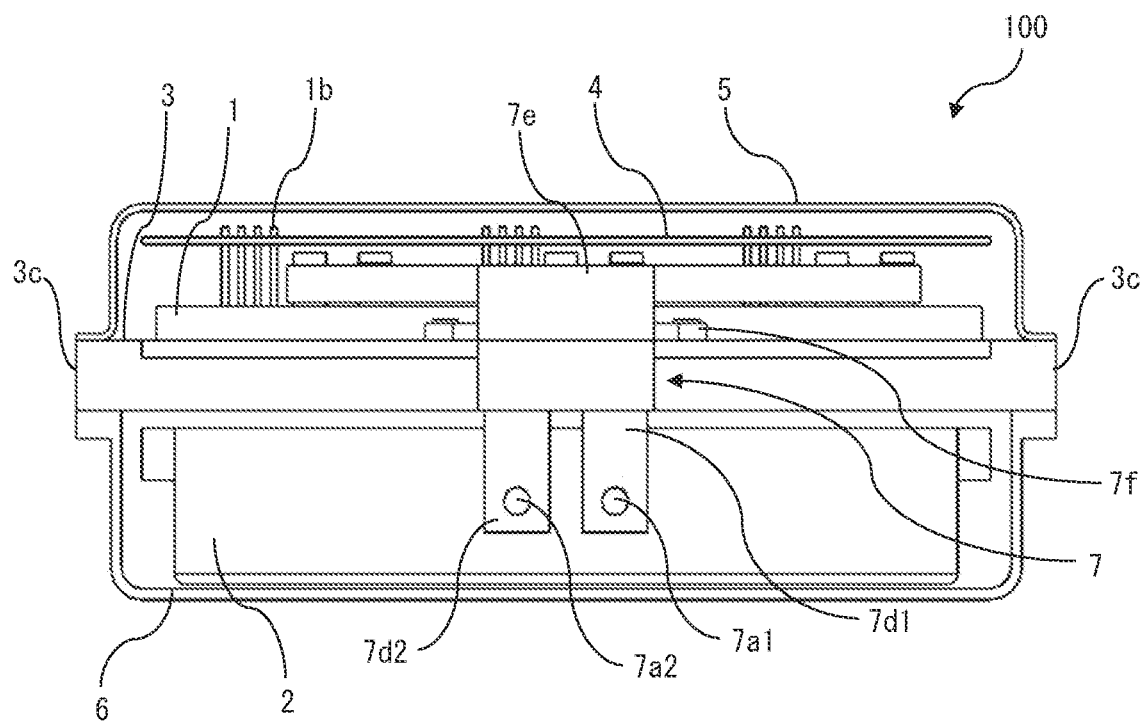
FIG. 8 is a sectional view of the power conversion device according to the second embodiment.

A power conversion device 100 according to the second embodiment of the present disclosure will be described. FIG. 6 is an exploded perspective view of the power conversion device 100 according to the second embodiment, FIG. 7 is a sectional view of the power conversion device 100 schematically showing the power conversion device 100 when cut at a position equivalent to the A-A cross-section position in FIG. 1, and FIG. 8 is a sectional view of the power conversion device 100 when cut at a position equivalent to the B-B cross-section position in FIG. 1, with the screws 10 not shown. In the power conversion device 100 according to the second embodiment, the structure of the connection busbar 7 is different from that in the first embodiment.

As shown in FIG. 6, the semiconductor module 1 has six second connection terminals 1c. The six second connection terminals 1c extend in the normal direction of the top surface 3a of the cooler 3 from the other surface of the body portion 1a of the semiconductor module 1. The connection busbar 7 has terminal connection portions 7b, conductor plates 7c, extending connection portions 7d, and the capacitor connection portions 7a. The terminal connection portions 7b are terminals respectively connected to the six second connection terminals 1c. The conductor plates 7c are plates mutually connecting the six terminal connection portions 7b. The extending connection portions 7d are connected to the conductor plates 7c and extend in parallel to the extending directions of the outer extending portions 22c. The capacitor connection portions 7a are provided at ends of the extending connection portions 7d on the outer extending portion 22c side. Each capacitor connection portion 7a is a through hole. The capacitor connection portion 7a is fastened by the screw 10 to the screw hole 22c1 provided at an end of the outer extending portion 22c, whereby the connection busbar 7 and the capacitor busbar 22 are electrically connected to each other.

With this structure, as compared to a case where a capacitor busbar sealed with resin extends from the capacitor module side to the semiconductor module side, the dimension accuracy of placement of the connection part of the capacitor busbar 22 with the semiconductor module 1 can be improved. Thus, ease of assembly of the power conversion device 100 is improved, a required clearance between components in assembling is reduced, and the insulation distance for which the dimension accuracy of placement of the capacitor busbar 22 is considered can be shortened, whereby the power conversion device 100 can be downsized. In addition, since the terminal connection portions 7b of the connection busbar 7 are respectively connected to the plurality of second connection terminals 1c, the numbers of the connection busbars 7 and the capacitor busbars 22 can be decreased as compared to the first embodiment. Since the numbers of the connection busbars 7 and the capacitor busbars 22 can be decreased, productivity of the power conversion device 100 can be improved.

The connection busbar 7 is made of metal such as copper or a copper alloy which is high in electric conductivity and thermal conductivity. At least parts of the extending connection portions 7d, and the conductor plates 7c, are covered by resin 7e. With this structure, insulation property between the parts of the extending connection portions 7d and the conductor plates 7c covered by the resin 7e, and a conductive part therearound, can be improved.

The connection busbar 7 is fixed to the cooler 3 at a part of the resin 7e. The resin 7e is provided with brims 7f which are parts extending along the top surface 3a, and insert bushes 12 are provided at the brims 7f. The connection busbar 7 is fixed to the cooler 3 via the insert bushes 12. A fixation method for the connection busbar 7 is not limited thereto. A protrusion provided at a part of the resin 7e and a hole provided on the top surface 3a side of the cooler 3 may be fitted to each other, whereby the connection busbar 7 may be fixed to the cooler 3. With such a structure, the connection busbar 7 is in contact with the cooler 3 via the resin 7e, whereby the connection busbar 7 can be efficiently cooled. In addition, via the connection busbar 7, the second connection terminals 1c and the capacitor busbars 22 can be efficiently cooled. In addition, owing to the brims 7f, the connection busbar 7 can be accurately placed at the cooler 3, whereby productivity of the capacitor busbars 22 and the connection busbar 7 can be improved.

In the present embodiment, as shown in FIG. 7, the resin 7e is provided in a range to the part of the penetration opening 34. However, without limitation thereto, the resin 7e may be provided so as to extend to the side surface part of the capacitor module 2. In the present embodiment, the connection busbar 7 is adjacent to the semiconductor module 1, and the terminal connection portions 7b and the second connection terminals 1c are connected on the other surface side of the body portion 1a of the semiconductor module 1. Thus, a part of the connection busbar 7 can be placed at the other surface of the semiconductor module 1, whereby the power conversion device 100 can be downsized. In the case where a part of the connection busbar 7 is placed at the other surface of the semiconductor module 1, a metal plate or a metal foil can be provided above the connection busbar 7. The metal plate or the metal foil serves as a shield for reducing the influence of electromagnetic noise that the control board 4 receives from the outside.

The semiconductor module 1 and the capacitor module 2 may be connected using such a structure that wiring is made in a collective manner on each of the high potential side and the low potential side. The semiconductor module 1 has a plurality of second connection terminals 1c1 for high potential and a plurality of second connection terminals 1c2 for low potential. The capacitor busbars 22 have an outer extending portion 22c2 for high potential and an outer extending portion 22c3 for low potential.

The connection busbar 7 has terminal connection portions 7b1 for high potential respectively connected to the plurality of second connection terminals 1c1 for high potential, terminal connection portions 7b2 for low potential respectively connected to the plurality of second connection terminals 1c2 for low potential, a conductor plate 7c1 for high potential mutually connecting the plurality of terminal connection portions 7b1 for high potential, and a conductor plate 7c2 for low potential mutually connecting the plurality of terminal connection portions 7b2 for low potential. In addition, the connection busbar 7 has an extending connection portion 7d1 for high potential connected to the conductor plate 7c1 for high potential and extending in parallel to the extending direction of the outer extending portion 22c2 for high potential, an extending connection portion 7d2 for low potential connected to the conductor plate 7c2 for low potential and extending in parallel to the extending direction of the outer extending portion 22c3 for low potential, a capacitor connection portion 7a1 for high potential provided at an end of the extending connection portion 7d1 for high potential on the outer extending portion 22c2 side for high potential, and a capacitor connection portion 7a2 for low potential provided at an end of the extending connection portion 7d2 for low potential on the outer extending portion 22c3 side for low potential.

The conductor plate 7c1 for high potential and the conductor plate 7c2 for low potential are arranged in parallel to each other with an interval therebetween. With this structure, inductance reduction in the wiring between the semiconductor module 1 and the capacitor module 2 can be achieved.

As described above, in the power conversion device 100 according to the second embodiment, the connection busbar 7 has the terminal connection portions 7b, the conductor plates 7c, the extending connection portions 7d, and the capacitor connection portions 7a, and the terminal connection portions 7b are terminals respectively connected to the plurality of second connection terminals 1c. Thus, the numbers of the connection busbars 7 and the capacitor busbars 22 can be decreased, whereby productivity of the power conversion device 100 can be improved. In addition, in a case where the semiconductor module 1 and the capacitor module 2 are connected using the structure in which wiring is made in a collective manner on each of the high potential side and the low potential side, and the conductor plate 7c1 for high potential and the conductor plate 7c2 for low potential are arranged in parallel to each other with an interval therebetween, inductance reduction in the wiring between the semiconductor module 1 and the capacitor module 2 can be achieved.

In a case where the second connection terminals 1c extend in the normal direction of the top surface 3a of the cooler 3 from the other surface of the body portion 1a of the semiconductor module 1, a part of the connection busbar 7 can be placed at the other surface of the semiconductor module 1, whereby the power conversion device 100 can be downsized. In addition, in a case where at least parts of the extending connection portions 7d, and the conductor plates 7c, are covered by the resin 7e, insulation property between the parts of the extending connection portions 7d and the conductor plates 7c covered by the resin 7e, and a conductive part therearound, can be improved. In a case where the connection busbar 7 is fixed to the cooler 3 at a part of the resin 7e, the connection busbar 7 can be efficiently cooled. In addition, via the connection busbar 7, the second connection terminals 1c and the capacitor busbars 22 can be efficiently cooled.

Third Embodiment

Figure 9:
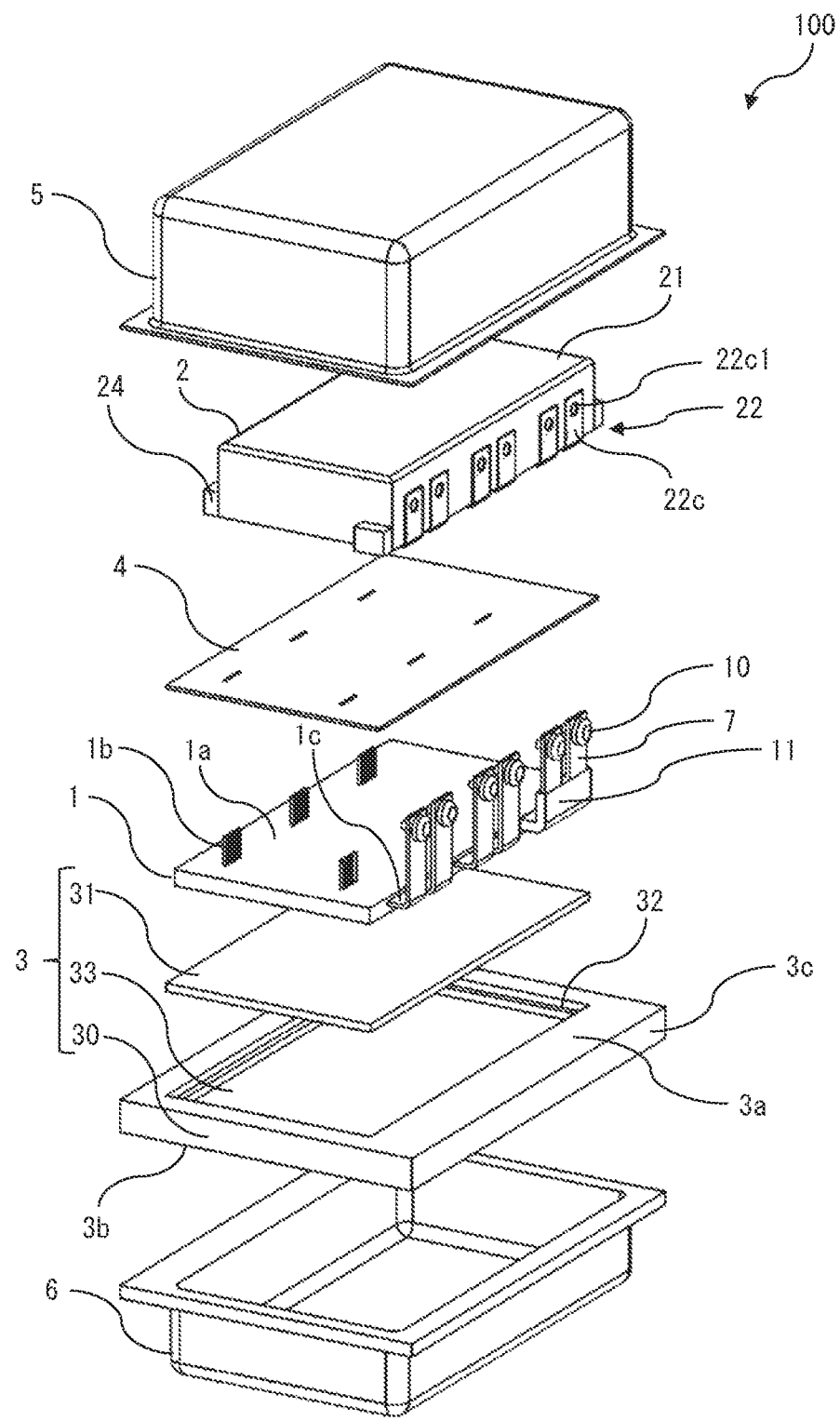
FIG. 9 is an exploded perspective view of a power conversion device according to the third embodiment of the present disclosure.
Figure 10:
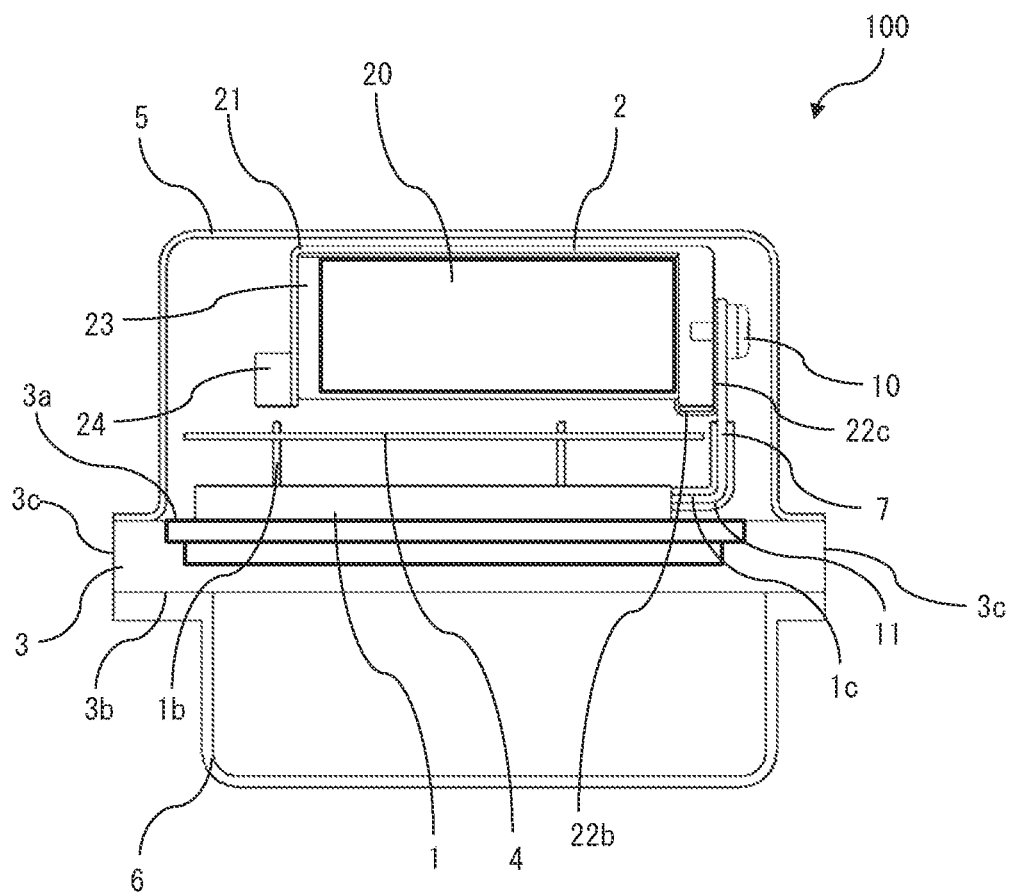
FIG. 10 is a sectional view of the power conversion device according to the third embodiment.
Figure 11:
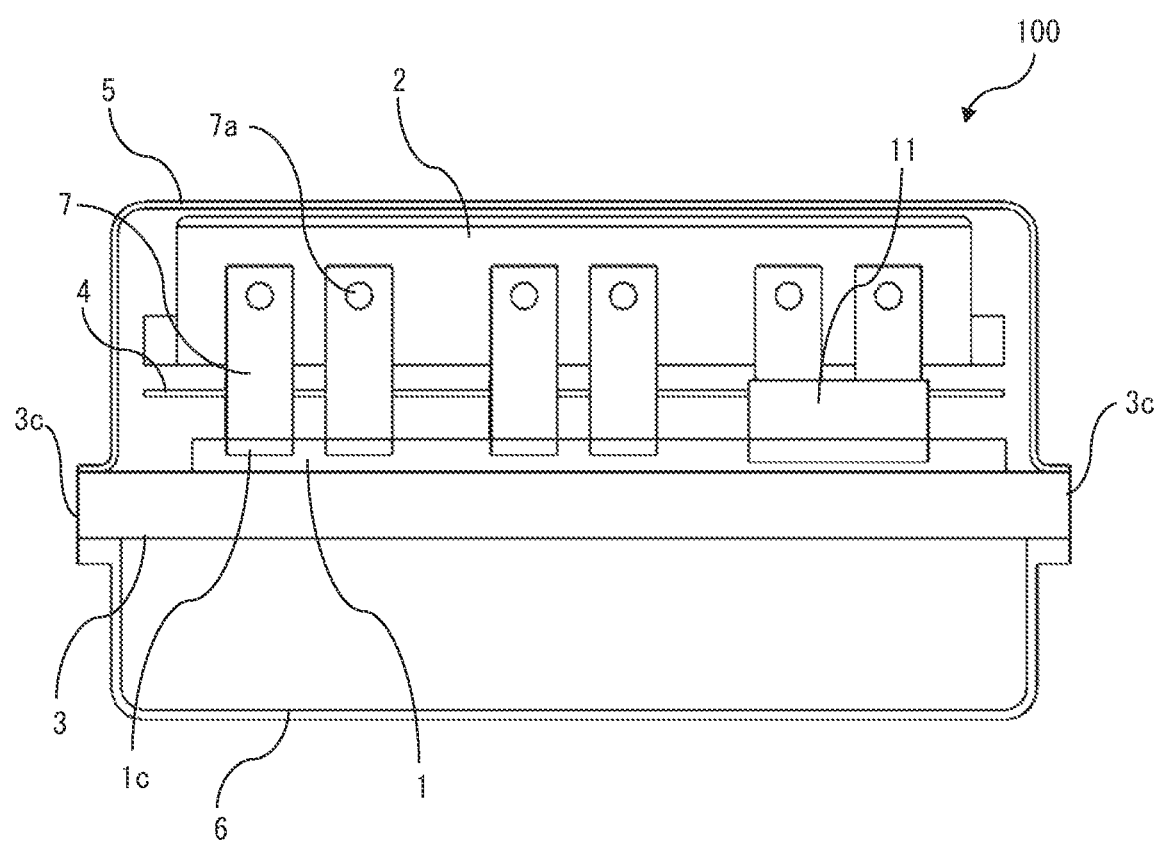
FIG. 11 is a sectional view of the power conversion device according to the third embodiment.

A power conversion device 100 according to the third embodiment of the present disclosure will be described. FIG. 9 is an exploded perspective view of the power conversion device 100 according to the third embodiment, FIG. 10 is a sectional view of the power conversion device 100 schematically showing the power conversion device 100 when cut at a position between the connection busbars 7 covered by the resin 11, and FIG. 11 is a sectional view of the power conversion device 100 when cut at a position equivalent to the B-B cross-section position in FIG. 1, with the screws 10 not shown. In the power conversion device 100 according to the third embodiment, placement of the capacitor module 2 is different from that in the first embodiment.

In the present embodiment, as shown in FIG. 10, the capacitor module 2 is placed between the control board 4 and the cover 5, on the top surface 3a side of the cooler 3. Since the control board 4 is placed between the semiconductor module 1 and the capacitor module 2, the connection busbar 7 extends from the second connection terminal 1c of the semiconductor module 1 to the outer surface of the outer extending portion 22c while passing at a side of the control board 4. The connection busbar 7 has a part extending in parallel to the extending direction of the outer extending portion 22c. The connection busbar 7 has the capacitor connection portion 7a connected to the outer extending portion 22c, at an end of the connection busbar 7 on the outer extending portion 22c side. The capacitor connection portion 7a is a through hole. The capacitor connection portion 7a is fastened by the screw 10 to the screw hole 22c1 provided at an end of the outer extending portion 22c, whereby the connection busbar 7 and the capacitor busbar 22 are electrically connected to each other.

With the above structure, in the power conversion device 100 according to the third embodiment, as compared to a case where a capacitor busbar sealed with resin extends from the capacitor module side to the semiconductor module side, the dimension accuracy of placement of the connection part of the capacitor busbar 22 with the semiconductor module 1 can be improved. Thus, ease of assembly of the power conversion device 100 is improved, a required clearance between components in assembling is reduced, and the insulation distance for which the dimension accuracy of placement of the capacitor busbar 22 is considered can be shortened, whereby the power conversion device 100 can be downsized.

Since the capacitor module 2 is not placed on the bottom surface 3b side of the cooler 3, electric components required to be cooled, such as the boost reactor, the boost converter, and the step-down converter, can be placed on the bottom surface 3b side of the cooler 3, whereby these electric components can be efficiently cooled by the cooler 3. In addition, these electric components can be efficiently arranged near the cooler 3, whereby the space-saving power conversion device 100 can be obtained. In addition, since the connection busbar 7 does not penetrate through the cooler 3, the penetration opening 34 is not needed for the cooler 3, and thus productivity of the power conversion device 100 can be improved.

Fourth Embodiment

Figure 12:
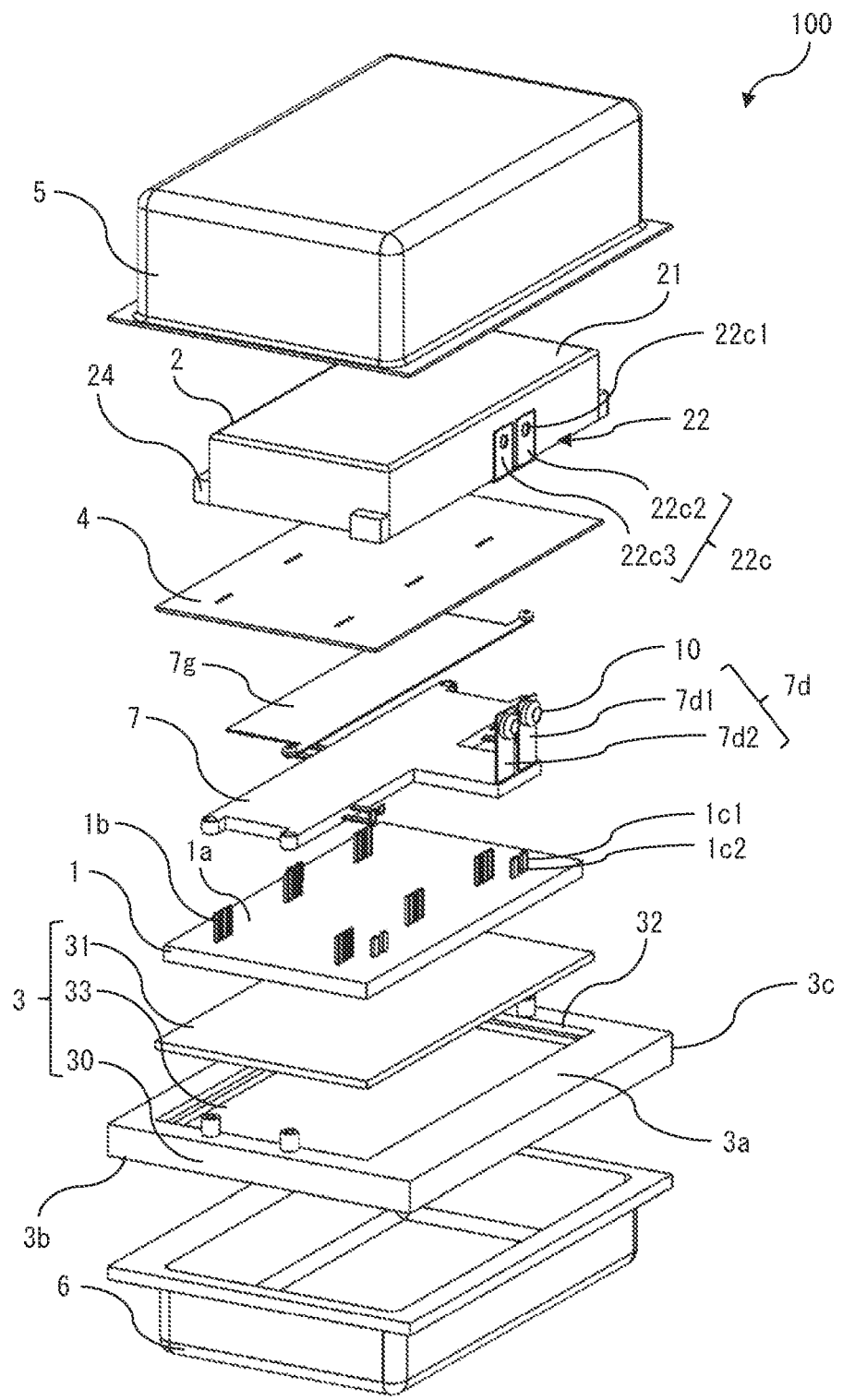
FIG. 12 is an exploded perspective view of a power conversion device according to the fourth embodiment of the present disclosure.
Figure 13:
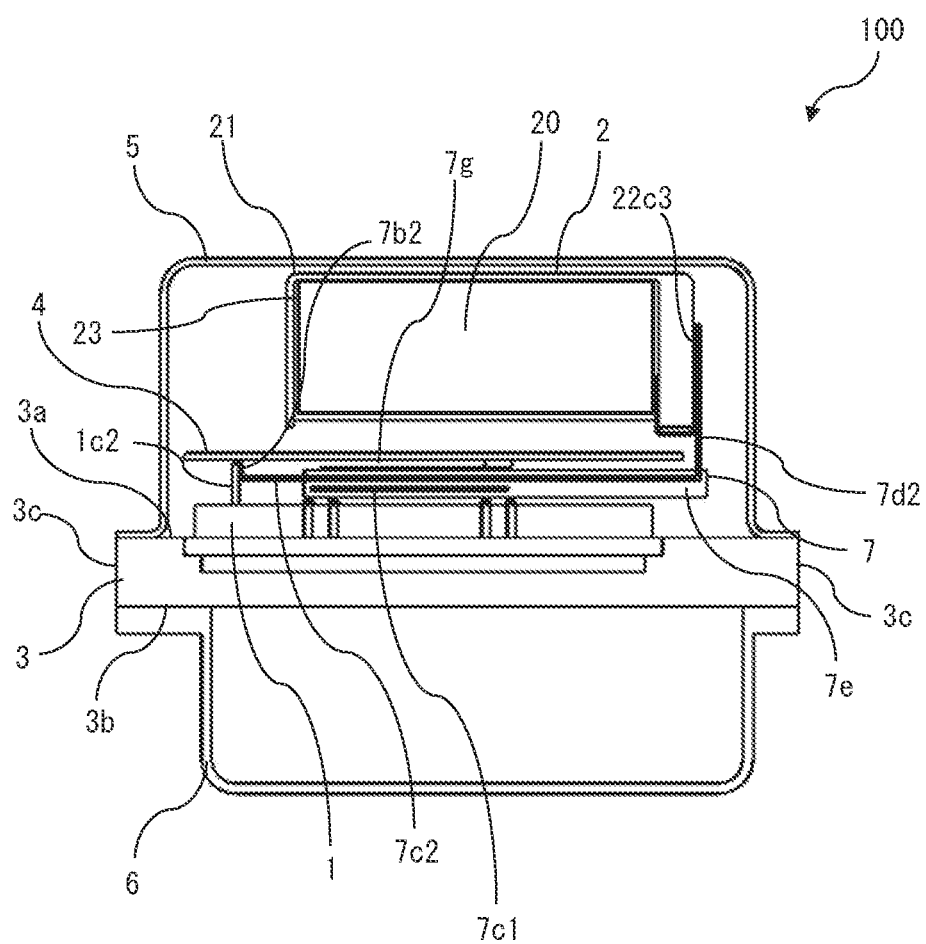
FIG. 13 is a sectional view of the power conversion device according to the fourth embodiment.
Figure 14:
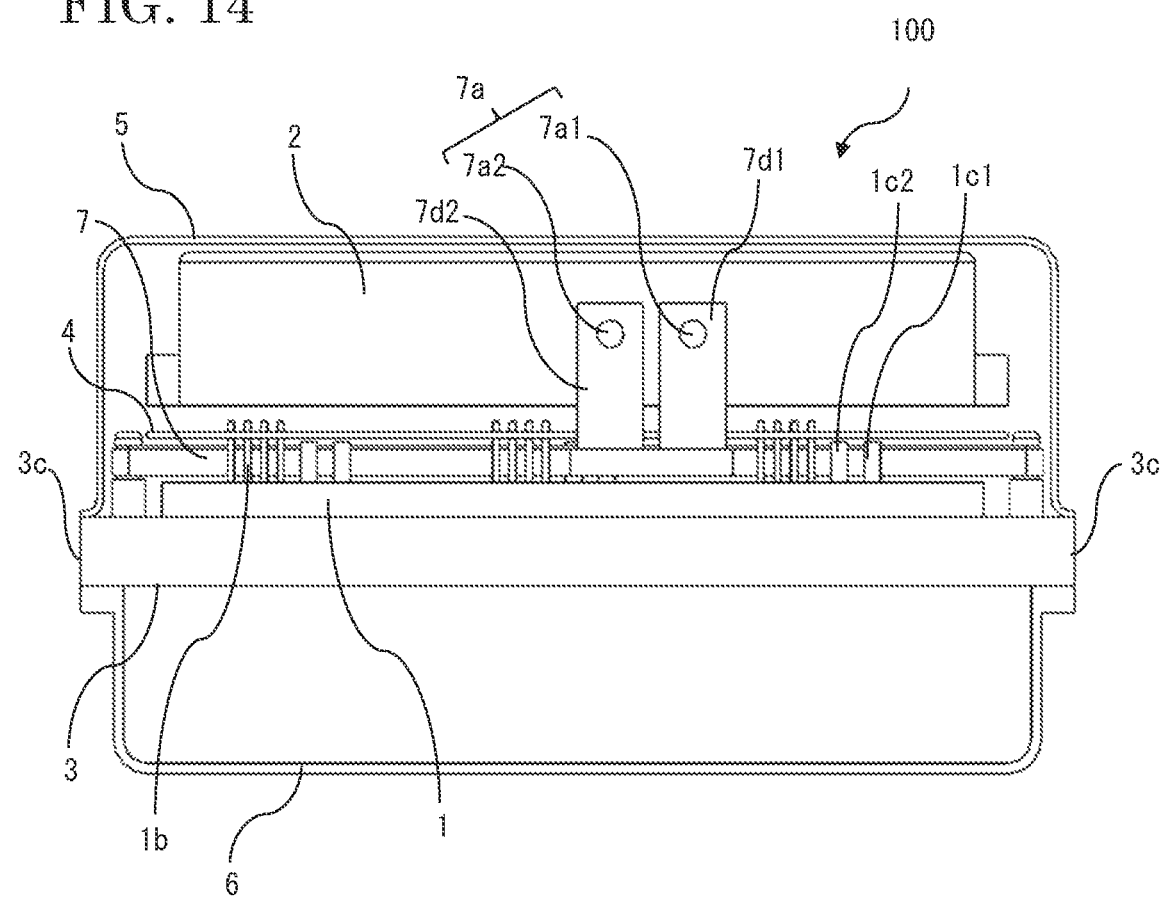
FIG. 14 is a sectional view of the power conversion device according to the fourth embodiment.

A power conversion device 100 according to the fourth embodiment of the present disclosure will be described. FIG. 12 is an exploded perspective view of the power conversion device 100 according to the fourth embodiment, FIG. 13 is a sectional view of the power conversion device 100 schematically showing the power conversion device 100 when cut at a position of the extending connection portion 7d2 for low potential along a line not passing the screw 10, and FIG. 14 is a sectional view of the power conversion device 100 when cut at a position equivalent to the B-B cross-section position in FIG. 1, with the screws 10 not shown. In the power conversion device 100 according to the fourth embodiment, placement of the capacitor module 2 is different from that in the second embodiment.

In the present embodiment, as shown in FIG. 13, the capacitor module 2 is placed between the control board 4 and the cover 5, on the top surface 3a side of the cooler 3. Since the control board 4 is placed between the semiconductor module 1 and the capacitor module 2, the extending connection portion 7d of the connection busbar 7 extends in parallel to the extending direction of the outer extending portion 22c while passing at a side of the control board 4. The capacitor connection portion 7a is provided at an end of the extending connection portion 7d on the outer extending portion 22c side. The capacitor connection portion 7a is a through hole. The capacitor connection portion 7a is fastened by the screw 10 to the screw hole 22c1 provided at an end of the outer extending portion 22c, whereby the connection busbar 7 and the capacitor busbar 22 are electrically connected to each other.

In the present embodiment, a part of the connection busbar 7 covered by the resin 7e is placed at the other surface of the semiconductor module 1, and as shown in FIG. 12, a shield 7g formed from a metal plate or a metal foil is placed above the resin 7e of the connection busbar 7. The shield 7g is electrically connected to the cooler 3 with a low impedance. The shield 7g reduces the influence of electromagnetic noise that the control board 4 receives from the outside.

As described above, in the power conversion device 100 according to the fourth embodiment, the shield 7g connected to the cooler 3 with a low impedance is provided between the semiconductor module 1 and the control board 4, whereby the influence of electromagnetic noise that the control board 4 receives from the outside can be efficiently reduced.

Fifth Embodiment

Figure 15:
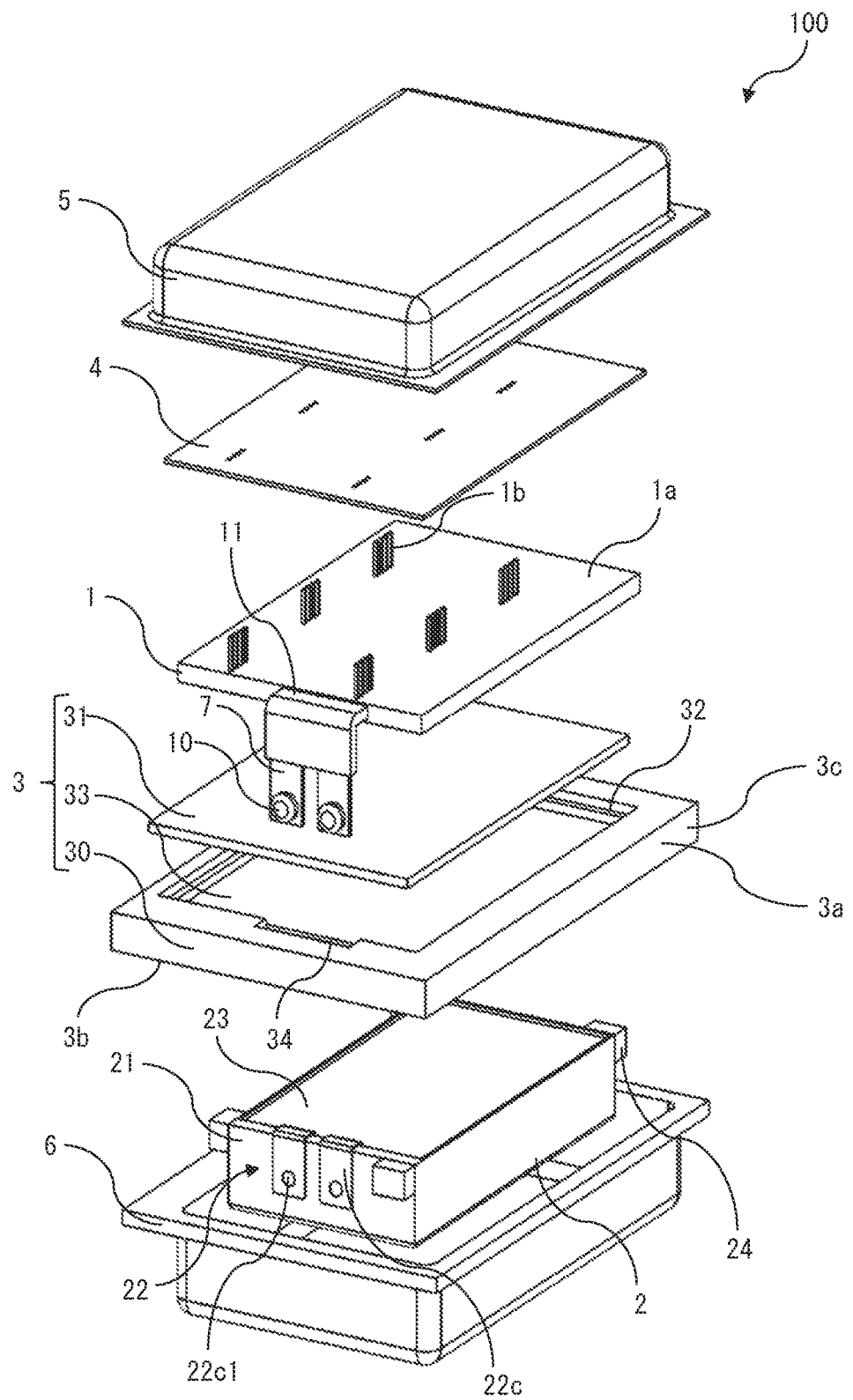
FIG. 15 is an exploded perspective view of a power conversion device according to the fifth embodiment of the present disclosure.
Figure 16:
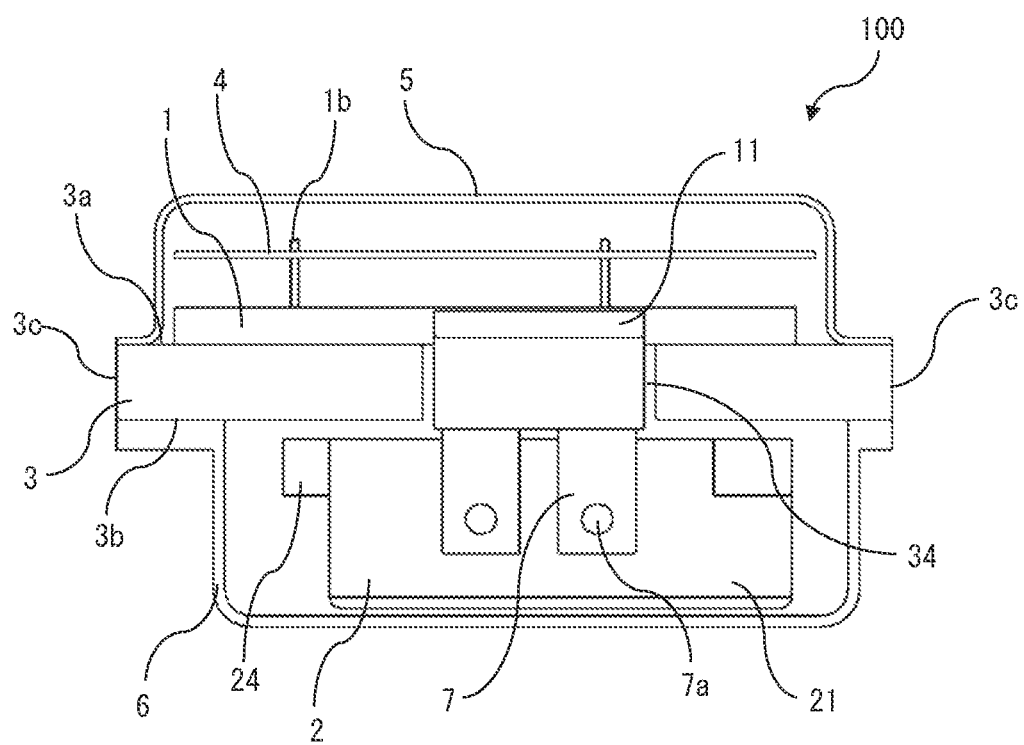
FIG. 16 is a sectional view of the power conversion device according to the fifth embodiment.
Figure 17:
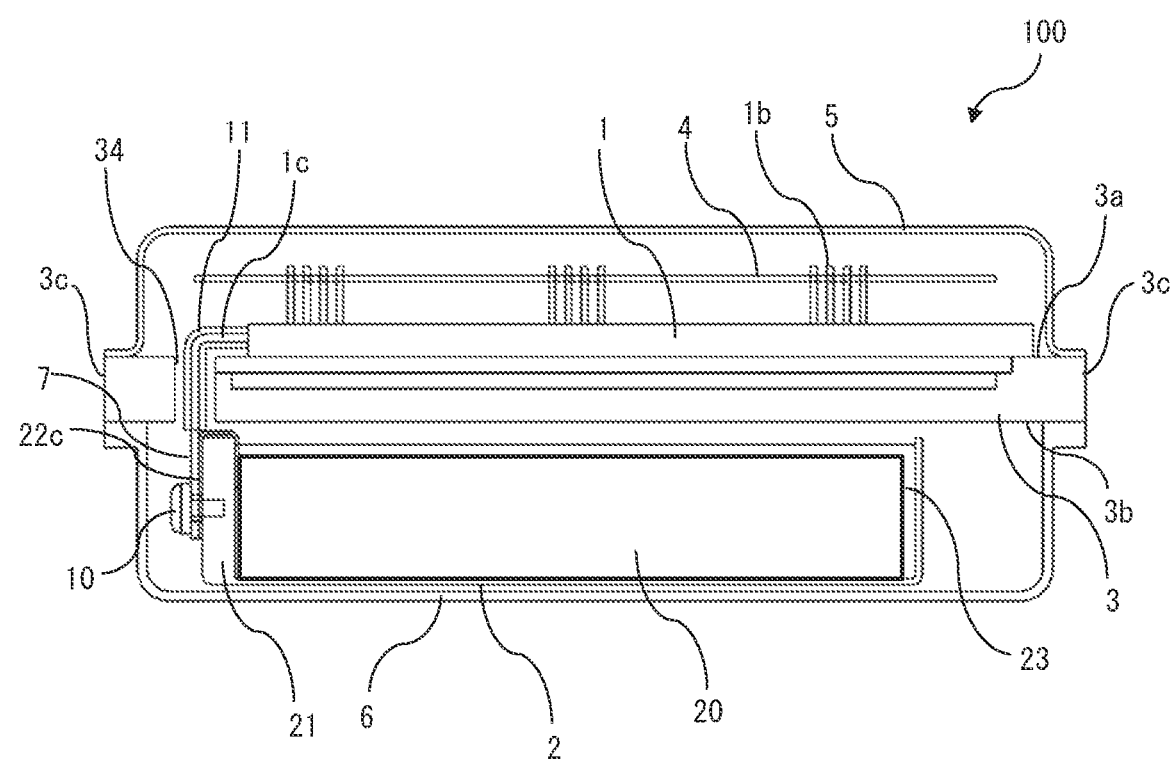
FIG. 17 is a sectional view of the power conversion device according to the fifth embodiment.

A power conversion device 100 according to the fifth embodiment of the present disclosure will be described. FIG. 15 is an exploded perspective view of the power conversion device 100 according to the fifth embodiment, FIG. 16 is a sectional view of the power conversion device 100 schematically showing the power conversion device 100 when cut at a position of the penetration opening 34 of the cooler 3, with the screws 10 not shown, and FIG. 17 is a sectional view of the power conversion device 100 when cut at a position between a side of the semiconductor module 1 and the first connection terminals 1b. In the power conversion device 100 according to the fifth embodiment, arrangement of the connection busbars 7 and the capacitor busbars 22 is different from that in the first embodiment.

The capacitor case 21 is formed in a bottomed rectangular tubular shape, and the body portion 1a of the semiconductor module 1 is formed in a rectangular plate shape. The second connection terminals 1c are provided on the front surface side at a short side of the body portion 1a of the semiconductor module 1. The connection busbars 7 formed integrally with the second connection terminals 1c are provided on the front surface side at the short side of the body portion 1a of the semiconductor module 1. The capacitor busbars 22 are provided on the front surface side at a short side of the bottom wall of the capacitor case 21. The capacitor connection portion 7a of each connection busbar 7 is fastened by the screw 10 to the screw hole 22c1 provided at an end of the outer extending portion 22c, whereby the connection busbar 7 and the capacitor busbar 22 are electrically connected to each other.

In the present embodiment, the connection busbars 7 and the capacitor busbars 22 are provided only at one short side of the body portion 1a of the semiconductor module 1 and one short side of the bottom wall of the capacitor case 21. However, without limitation thereto, the connection busbars 7 and the capacitor busbars 22 may be provided also at another short side of the body portion 1a of the semiconductor module 1 and another short side of the bottom wall of the capacitor case 21. In the case where the connection busbars 7 and the capacitor busbars 22 are provided at both short sides, the connection busbars 7 and the capacitor busbars 22 are electrically connected to each other at both short sides.

The structure of the connection busbar 7 is not limited to the structure in which the connection busbar 7 is formed integrally with the second connection terminal 1c. The connection busbar 7 may be formed separately as shown in the second embodiment. The capacitor module 2 may be placed on the top surface 3a side of the cooler 3.

As described above, in the power conversion device 100 according to the fifth embodiment, the structure for connecting the semiconductor module 1 and the capacitor module 2 can be provided on the capacitor module 2 side, whereby it is possible to secure a space for placing the high-output semiconductor module 1 on the top surface 3a side of the cooler 3. Since the high-output semiconductor module 1 can be placed, the output of the power conversion device 100 can be increased. In addition, since the structure for connecting the semiconductor module 1 and the capacitor module 2 can be provided on the capacitor module 2 side, a connection space is not needed on the top surface 3a side of the cooler 3, and thus the power conversion device 100 can be downsized.

Sixth Embodiment

Figure 18:
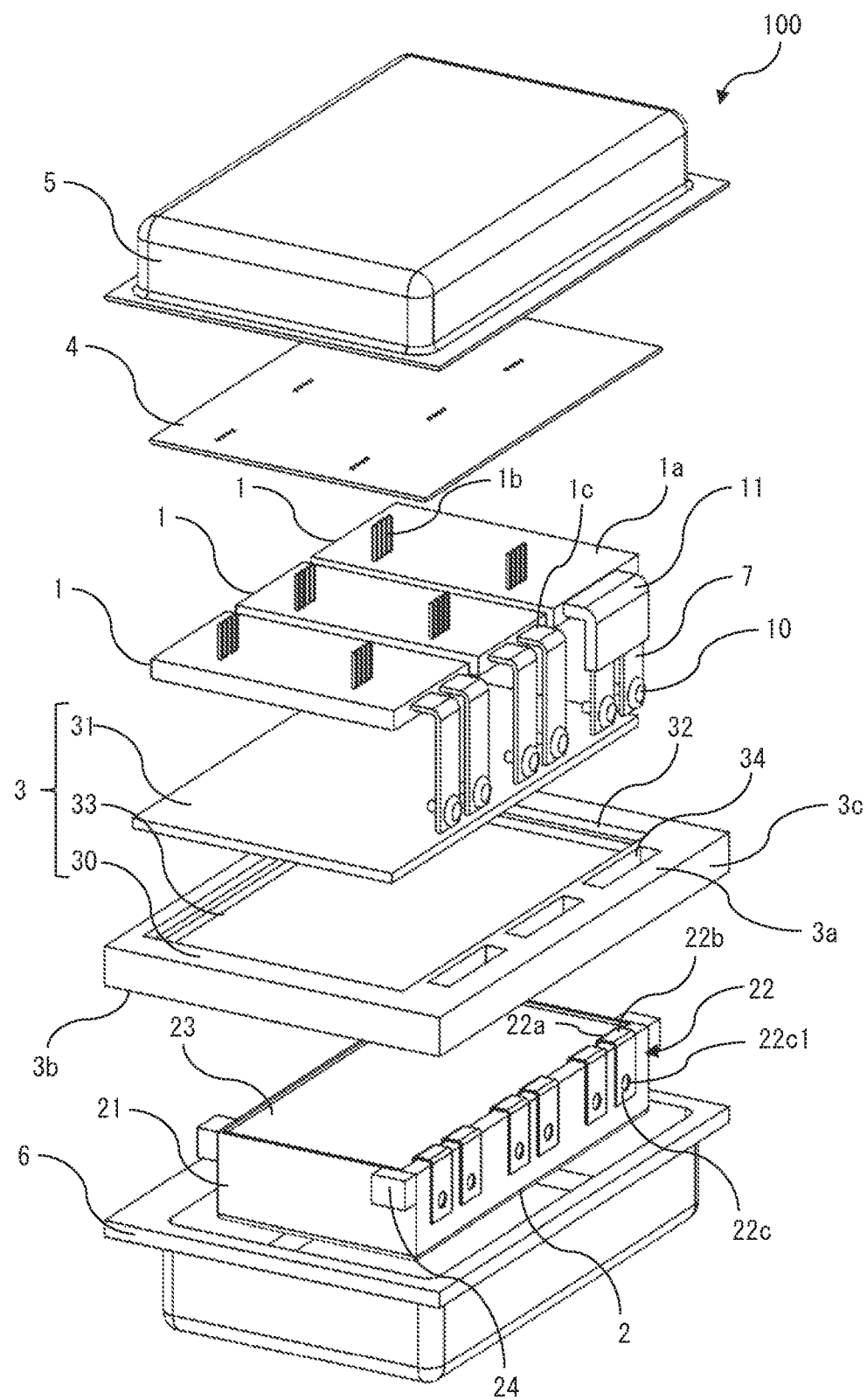
FIG. 18 is an exploded perspective view of a power conversion device according to the sixth embodiment of the present disclosure.

A power conversion device 100 according to the sixth embodiment of the present disclosure will be described. FIG. 18 is an exploded perspective view of the power conversion device 100 according to the sixth embodiment. The power conversion device 100 according to the sixth embodiment includes a plurality of semiconductor modules 1 unlike the first embodiment.

The power conversion device 100 includes a plurality of semiconductor modules 1. In the present embodiment, the power conversion device 100 includes three semiconductor modules 1, but the number of semiconductor modules 1 is not limited thereto. The plurality of semiconductor modules 1 are placed so as to be arranged in the same direction at the top surface 3a of the cooler 3. One surface of each of the plurality of semiconductor modules 1 is thermally connected to the top surface 3a of the cooler 3.

Each of the plurality of semiconductor modules 1 has second connection terminals 1c on the side surface side of the power conversion device 100. The connection busbars 7 formed integrally with the second connection terminals 1c are provided on the side surface side of the power conversion device 100. The capacitor busbars 22 are provided on the side surface side of the power conversion device 100. The capacitor connection portion 7a (not shown in FIG. 18) of each connection busbar 7 is fastened by the screw 10 to the screw hole 22c1 provided at an end of the outer extending portion 22c, whereby the connection busbar 7 and the capacitor busbar 22 are electrically connected to each other.

In the present embodiment, the connection busbars 7 and the capacitor busbars 22 are provided only at one side surface side of the power conversion device 100. However, without limitation thereto, the connection busbars 7 and the capacitor busbars 22 may be provided also at another side surface side of the power conversion device 100. In the case where the connection busbars 7 and the capacitor busbars 22 are provided at both side surface sides, the connection busbars 7 and the capacitor busbars 22 are electrically connected to each other at both side surface sides.

The structure of the connection busbar 7 is not limited to the structure in which the connection busbar 7 is formed integrally with the second connection terminal 1c. The connection busbar 7 may be formed separately as shown in the second embodiment. The capacitor module 2 may be placed on the top surface 3a side of the cooler 3.

As described above, in the power conversion device 100 according to the sixth embodiment, the power conversion device 100 includes a plurality of semiconductor modules 1, the plurality of semiconductor modules 1 are placed so as to be arranged in the same direction at the top surface 3a of the cooler 3, and one surface of each of the plurality of semiconductor modules 1 is thermally connected to the top surface 3a of the cooler 3. Thus, the semiconductor modules 1 having different output characteristics can be used in the power conversion device 100. In addition, the plurality of semiconductor modules 1 can be cooled by one cooler 3. In addition, in a case of operating a plurality of electric motors with three-phase AC power from the power conversion device 100, the power conversion device 100 can convert three-phase AC power in accordance with output needed for the electric motor.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 semiconductor module
1a body portion
1b first connection terminal
1c second connection terminal
1c1 second connection terminal for high potential
1c2 second connection terminal for low potential
2 capacitor module
3 cooler
3a top surface
3b bottom surface
3c side surface
4 control board
5 cover
6 case
7 connection busbar
7a capacitor connection portion
7b terminal connection portion
7c conductor plate
7d extending connection portion
7e resin
7f brim
7g shield
10 screw
11 resin 12 insert bush
20 capacitor cell
21 capacitor case
22 capacitor busbar
22a inner extending portion
22b opening-side extending portion
22c outer extending portion
22c1 screw hole
22c2 outer extending portion for high potential
22c3 outer extending portion for low potential
23 resin
24 fastening leg
30 body portion
31 base
32 joining portion
33 coolant passage
34 penetration opening
100 power conversion device

What is claimed is:

1. A power conversion device comprising:
   a semiconductor module having a body portion which has a semiconductor element therein and is formed in a plate shape, and a connection terminal electrically connected to the semiconductor element and protruding from the body portion;
   a cooler having a bottom surface, a top surface, and a side surface, the top surface being thermally connected to one surface of the semiconductor module;
   a control board for controlling operation of the semiconductor module;
   a capacitor module placed on the bottom surface side of the cooler or the top surface side of the cooler, and electrically connected to the semiconductor module;
   a cover which stores the semiconductor module and the control board, and stores the capacitor module when the capacitor module is placed on the top surface side, the cover being fixed to the top surface of the cooler;
   a case which stores the capacitor module when the capacitor module is placed on the bottom surface side, the case being fixed to the bottom surface of the cooler; and
   a connection busbar connecting the connection terminal of the semiconductor module and the capacitor module, wherein
   the semiconductor module, the cooler, the control board, and the capacitor module are arranged in an overlapped manner as seen in a direction perpendicular to the top surface of the cooler,
   the capacitor module has a capacitor cell, a bottomed tubular capacitor case which stores the capacitor cell and opens on the cooler side, resin sealing the capacitor cell inside the capacitor case, and a capacitor busbar electrically connected to the capacitor cell and exposed to outside from the resin,
   the capacitor busbar has an inner extending portion extending to an opening side along an inner surface of a side wall of the capacitor case, an opening-side extending portion extending from an opening-side end of the inner extending portion to an outer side along an opening-side end surface of the side wall, and an outer extending portion extending from an outer end of the opening-side extending portion to a bottom wall side along an outer surface of the side wall, and
   the connection busbar extends from the connection terminal of the semiconductor module to an outer surface of the outer extending portion and has a part extending in parallel to an extending direction of the outer extending portion, and the connection busbar has a capacitor connection portion connected to the outer extending portion, at an end of the connection busbar on the outer extending portion side.

2. The power conversion device according to claim 1, wherein
   the connection terminal of the semiconductor module and the connection busbar are integrally formed.

3. The power conversion device according to claim 2, wherein
   at least parts of the connection terminal and the connection busbar are covered by resin.

4. The power conversion device according to claim 1, wherein
   the semiconductor module has a plurality of the connection terminals, and
   the connection busbar has
      terminal connection portions respectively connected to the plurality of connection terminals,
      a conductor plate mutually connecting a plurality of the terminal connection portions,
      an extending connection portion connected to the conductor plate and extending in parallel to the extending direction of the outer extending portion, and
      the capacitor connection portion provided at an end of the extending connection portion on the outer extending portion side.

5. The power conversion device according to claim 4, wherein
   the semiconductor module has a plurality of the connection terminals for high potential and a plurality of the connection terminals for low potential,
   the capacitor busbar has the outer extending portion for high potential and the outer extending portion for low potential,
   the connection busbar has
      the terminal connection portions for high potential respectively connected to the plurality of connection terminals for high potential,
      the terminal connection portions for low potential respectively connected to the plurality of connection terminals for low potential,
      the conductor plate for high potential mutually connecting a plurality of the terminal connection portions for high potential,
      the conductor plate for low potential mutually connecting a plurality of the terminal connection portions for low potential,
      the extending connection portion for high potential connected to the conductor plate for high potential and extending in parallel to the extending direction of the outer extending portion for high potential,
      the extending connection portion for low potential connected to the conductor plate for low potential and extending in parallel to the extending direction of the outer extending portion for low potential,
      the capacitor connection portion for high potential provided at the end of the extending connection portion for high potential on the outer extending portion side for high potential, and
      the capacitor connection portion for low potential provided at the end of the extending connection portion for low potential on the outer extending portion side for low potential, and
   the conductor plate for high potential and the conductor plate for low potential are arranged in parallel to each other with an interval therebetween.

6. The power conversion device according to claim 4, wherein
the connection terminals of the semiconductor module extend in a normal direction of the top surface of the cooler from another surface of the body portion of the semiconductor module.

7. The power conversion device according to claim 4, wherein
at least a part of the extending connection portion, and the conductor plate, are covered by resin.

8. The power conversion device according to claim 7, wherein
the connection busbar is fixed to the cooler at a part of the resin.

9. The power conversion device according to claim 1, wherein
the cooler has a through hole penetrating between the top surface and the bottom surface, and
the connection busbar is placed so as to penetrate through the through hole.

10. The power conversion device according to claim 1, wherein
the side surface of the cooler is exposed to outside.

11. The power conversion device according to claim 1, wherein
the capacitor case is formed in a bottomed rectangular tubular shape, and the body portion of the semiconductor module is formed in a rectangular plate shape, and
a length of one or both of a long side and a short side of the bottom wall of the capacitor case is respectively smaller than a length of one or both of a long side and a short side of the body portion of the semiconductor module.

12. The power conversion device according to claim 1, comprising a plurality of the semiconductor modules, wherein
the plurality of semiconductor modules are placed so as be arranged in the same direction at the top surface of the cooler, and
one surface of each of the plurality of semiconductor modules is thermally connected to the top surface of the cooler.

* * * * *